United States Patent [19]

McClanahan et al.

[11] Patent Number: 5,513,594
[45] Date of Patent: May 7, 1996

[54] CLAMP WITH WAFER RELEASE FOR SEMICONDUCTOR WAFER PROCESSING EQUIPMENT

[76] Inventors: Adolphus E. McClanahan, 870 S. Saratoga Ave. #F-110, San Jose, Calif. 95129; Frederick T. Turner, 1478 Bittern Dr., Sunnyvale, Calif. 94087; Kenneth E. Anderson, 1958 Janet Ave., San Jose, Calif. 95124; Phillip B. Nicholson, 4577 Doyle Rd., San Jose, Calif. 95129; Martin A. Hutchinson, 3846 Shasta Dr., Santa Clara, Calif. 95051-5848

[21] Appl. No.: 140,351

[22] Filed: Oct. 20, 1993

[51] Int. Cl.⁶ .................................................. B05C 13/00
[52] U.S. Cl. ................... 118/503; 118/505; 204/298.15; 204/298.35; 269/254 R; 269/287
[58] Field of Search .................................. 118/503, 505, 118/728; 269/903, 254 R, 287, 13; 204/298.15, 298.35; 156/345; 414/217; 901/31

[56] References Cited

U.S. PATENT DOCUMENTS

| 4,473,455 | 9/1984 | Dean et al. ...................... 204/298.15 |
| 4,817,556 | 4/1989 | Mears et al. ......................... 269/254 R |
| 5,262,029 | 11/1993 | Erskine et al. ......................... 118/503 |
| 5,280,894 | 1/1994 | Witcraft et al. ......................... 269/287 |

FOREIGN PATENT DOCUMENTS

| 2177167 | 8/1987 | Japan. |
| 8910243 | 11/1989 | WIPO ..................................... 901/31 |

*Primary Examiner*—Laura Collins

[57] ABSTRACT

An apparatus for releasably clamping a substrate to a support platform, or other support system, at a face of the substrate is described. In one embodiment, a retractable clamp holds a substrate near its edges on a support platform when the clamp is in its fully extended position. One or more leaf springs are mounted to the clamp and apply force to the substrate at respective points in the event the substrate adheres to the clamp, thereby releasing the substrate from the clamp. In a preferred embodiment of the present invention, one or more activators are positioned in cooperative relationship to the leaf springs to cause the leaf springs to retract into recesses in the clamp when the clamp is extended against the substrate. In their retracted position, the leaf springs do not contact the substrate so as to minimize the generation of particle contamination and the chance of the release leaf springs themselves adhering to the substrate.

11 Claims, 6 Drawing Sheets

CLAMP WITH WAFER RELEASE FOR SEMICONDUCTOR WAFER PROCESSING EQUIPMENT

FIELD OF THE INVENTION

The present invention relates to semiconductor wafer processing and, in particular, to apparatus and methods for releasably clamping wafers to support platforms in semiconductor processing equipment.

BACKGROUND OF THE INVENTION

In the semiconductor wafer and substrate processing fields various types of processing equipment are now commonplace which provide for automated handling of wafers in a vacuum environment. A paramount concern in the handling and processing of such wafer substrates is the need to minimize particle generation that could contaminate the wafers damaging the devices being formed thereon. For this reason, most semiconductor device fabrication is conducted within a "clean room" environment where extreme measures are taken to minimize the presence of particulate matter.

It is known that the mechanical movement of machine parts is responsible for generation of unwanted particles and, accordingly, the movement of various automated wafer transport and stationing mechanisms within wafer processing equipment is carefully controlled. Many types of wafer processing equipment are designed to process wafers individually, i.e., one at a time or serially, as opposed to batch processing. In such equipment, wafers are typically loaded in the processing system by a cassette and individually and automatically transferred from the cassette to one or more processing stations. A number of systems have recently been developed with a plurality of processing stations housed within a single vacuum environment. The stations may perform processing steps such as, for example, sputtering, chemical vapor deposition (CVD), plasma etching, heating, etc. These systems typically include one or more load-lock chambers where the wafers are introduced and removed from the vacuum environment. In so-called "cluster tool" systems, the wafers are typically transferred by means, such as robot arms, between the load-lock chamber and the process stations within the vacuum environment.

At a process station, it may be necessary to hold the wafer firmly against a support surface with a clamp during processing, such as for example to maintain the position of the wafer relative to the processing equipment or to maintain good thermal contact to a heat transfer element. A common technique for maintaining the temperature of a wafer undergoing processing in a vacuum environment is to introduce a conductive gas in a narrow space at the backside of the wafer, thereby thermally coupling the wafer to a temperature control element. When using a backside gas, which is introduced at a pressure higher than the ambient pressure of the processing chamber, clamp means are required to ensure that the backside gas does not move the wafer off of the support surface.

In most cluster tool systems, and many other types of semiconductor processing equipment, the wafers are loaded onto and removed from the process platform in a horizontal orientation. This allows gravity to be used to hold the wafer in place on the surface of the platform while the wafer is clamped and unclamped. Thus, unclamping normally involves simply translating the clamp mechanism in an upward direction, relying on gravity to cause separation of the wafer and the clamp.

Unfortunately, the particular process used in a process chamber may cause the clamp to adhere to a wafer after completion of processing of the wafer at the process station, thus preventing the wafer from being picked up by the robot arm or other transport mechanism. This may occur, for example, when depositing a metal layer over a wafer which causes the wafer to stick to the clamp. Another example is when a wafer having a top layer of a material which melts or becomes plastic at an elevated temperature used in a processing step, causing the top layer to adhere to the clamp.

When a wafer sticks to a clamp, the processing system typically must be shut down to free the stuck wafer, a procedure that normally involves manual intervention at atmospheric pressure. After the process chamber is vented to atmosphere to permit manual wafer removal, it can take several hours before the chamber can be placed back in service due to the need to pump down the chamber and allow outgassing of contaminants (e.g., water vapor, etc.) that have become adsorbed to the chamber surfaces. Thus, it can easily take four to five hours to recover from a stuck wafer.

Of particular concern to the present invention are sputtering systems where a layer of metal is formed over a wafer or substrate at a controlled elevated temperature. As described above, when sputter coating a silicon wafer, it is advantageous to clamp the wafer to the heater table or platform to allow the introduction of a backside gas. This gas serves as a heat transfer medium in the vacuum system to maintain the temperature of the wafer within a desired temperature range during the sputtering operation. On occasion, the wafer sticks to the clamp when the sputtering system tries to un-clamp the wafer, thereby preventing the transfer of the wafer to the robot arm which will carry the wafer to the load-lock station or to the next process station. The above-described manual intervention operation must be used, usually causing several hours of lost processing time. The lost time decreases the wafer throughput of the system, typically causing revenues losses for the user due to the decreased throughput.

Prior art processing systems have either not addressed this problem or have addressed it in a way which is not entirely satisfactory. One approach to minimize the possibility of sticking uses clamps having contact surfaces which are slightly beveled to cause the clamp to only contact at the outside edge of the wafer, as far away from the deposition process as possible. An overhang formed by the projection of the beveled edge may be used to block sputtered material from being deposited in the area where the clamp makes contact with the wafer. However, the beveled surface does not completely eliminate the possibility of sticking because, with time, sputtered material makes its way under the clamp's edge and back to the area of the clamp surface which contacts the wafer's edge. It has been found that such a system may experience one wafer sticking per one thousand wafers processed. This level is in need of improvement. Moreover, as indicated above, there are some instances where material has been previously deposited at the edge of the wafer. When such wafers are clamped for further processing, the possibility of sticking can be considerably higher. Accordingly, there is a need to substantially reduce the number of incidents in which a wafer or substrate becomes stuck to a clamp in such systems.

SUMMARY OF THE INVENTION

The present invention recognizes the need for a means of releasing a wafer from a clamp if it should stick and to preferably do so in such a manner which introduces the least amount of particulate contamination and enables the processing station and system to continue normal operations without losing time due to the sticking occurrence. The present invention further recognizes that, in order to minimize the generation of particles, the release means should preferably not contact the wafer if the wafer is not struck as is normally the case.

The present invention encompasses an apparatus for releasably clamping a substrate to a support platform, or other support means. Broadly stated, the present invention comprises a clamp means which is translatable between an extended position and a retracted position. In its extended position, the clamp means securely engages the substrate against the support platform at one or more points on a face of the substrate, and near the edges of the substrate. In its retracted position, the clamp means disengages from the substrate and moves away from the support platform. The present invention further comprises a substrate release means mounted to the clamp means for preventing the substrate from sticking to the clamp means when the clamp means is retracted from its extended position. The substrate release means, which may comprise a leaf spring or other spring-loaded device, includes a substrate releasing surface translatable between an extended position and a retracted position relative to the clamp means. The substrate releasing surface is extended as the clamp means is moved away from the substrate, such that the substrate releasing surface applies a force against the substrate whenever the substrate adheres to the clamp means, thereby forcing the substrate free from the clamp means.

In a preferred embodiment of the present invention, the substrate release means is retracted when the clamp is fully extended such that it does not contact the substrate during normal wafer clamping. The retraction of the substrate release means during clamping reduces the generation of contamination particles since the substrate release means only contacts the wafer when it becomes stuck to the clamp and needs to be separated therefrom.

DETAILED DESCRIPTION OF THE INVENTION

Figure 1:
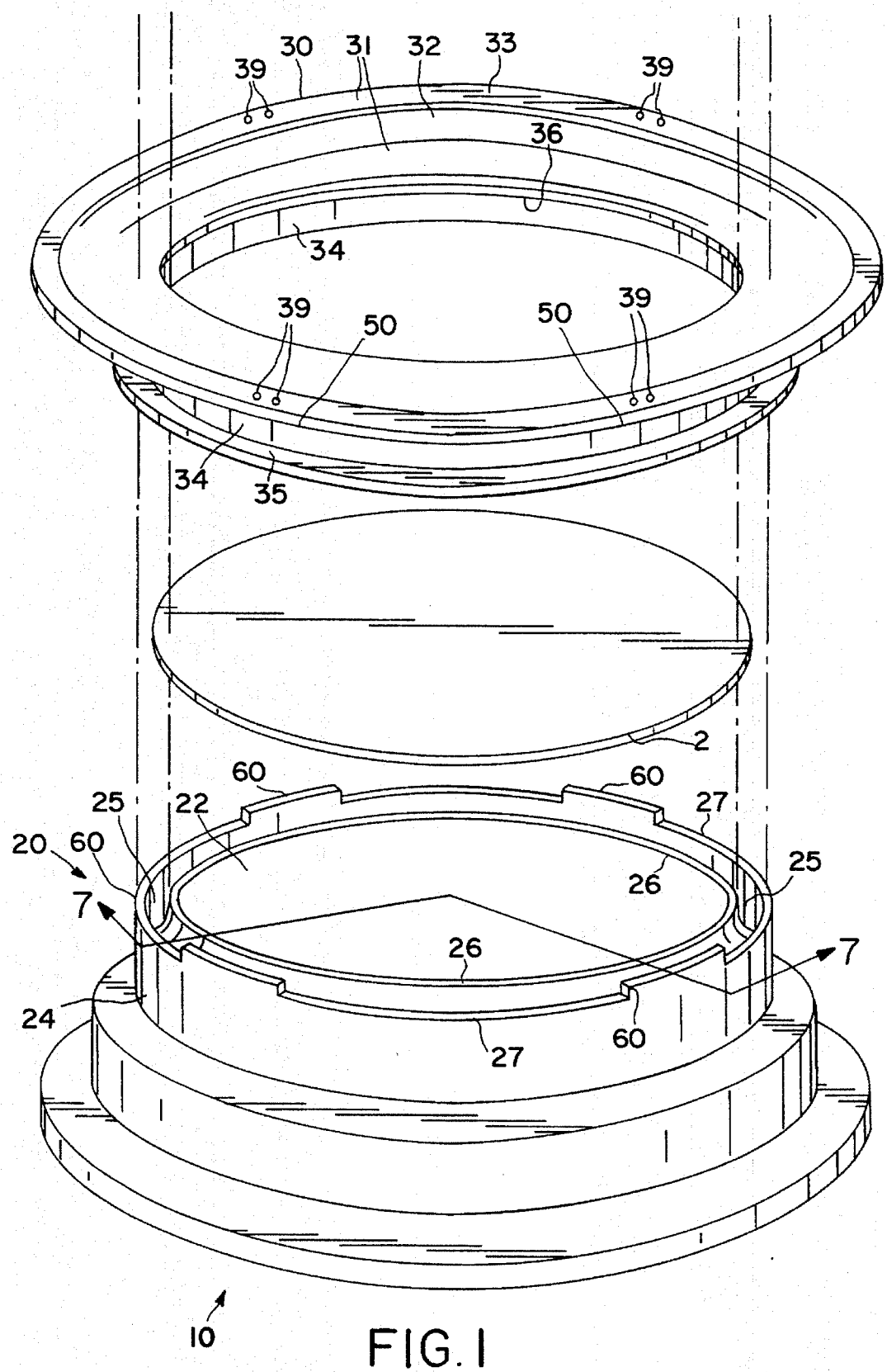
FIG. 1 shows an expanded top isometric view of a clamping apparatus according to the present invention.

FIG. 1 shows an expanded isometric view of a clamping apparatus 10 according to a preferred embodiment of the present invention. Clamping apparatus 10 is for holding a substrate 2, such as a semiconductor wafer, firmly against a working surface in a substrate processing station, such as a sputtering station. Clamping apparatus 10 comprises a support means 20 for providing the working surface for substrate 2 and a movable clamping mechanism 30 for securely holding substrate 2 against a platform 22 of support means 20 at the edges of substrate 2. Apparatus 10 further comprises a substrate release means, generally shown at reference numerals 50 and 60 in the figures, for releasing substrate 2 from clamping mechanism 30 should substrate 2 stick to the clamping mechanism 30. The operation of the substrate release means is described in greater detail below.

Platform 22 of support means 20 comprises a generally flat surface for receiving substrate 2, and serves as a working surface for substrate 2. In the embodiment shown in FIG. 1, platform 22 is round, having a diameter slightly less that the diameter of substrate 2. However, platform 22 need not have a smaller diameter nor have a round shape. For sputtering applications, platform 22 preferably comprises a temperature control means for maintaining the temperature of substrate 2 at a desired temperature. When conducting sputtering, a temperature control means is typically used to heat the wafer. In such cases, a heater shield 24 is placed around platform 22 to insulate platform 22 around its radial surface. Support means 20 preferably includes a groove 25 in the top surface of shield 24 which has an inner lip 26 around platform 22 and a castellated outer lip 27 around groove 25. Castellated outer lip comprises a plurality of raised portions 60 which are used to activate the wafer release means, as described in greater detail below. Activators 60 thus form a portion of the substrate release means. Groove 25 enables the outer edge of substrate 2 to flex in a downward direction when engaged by clamping mechanism 30.

Figure 2:
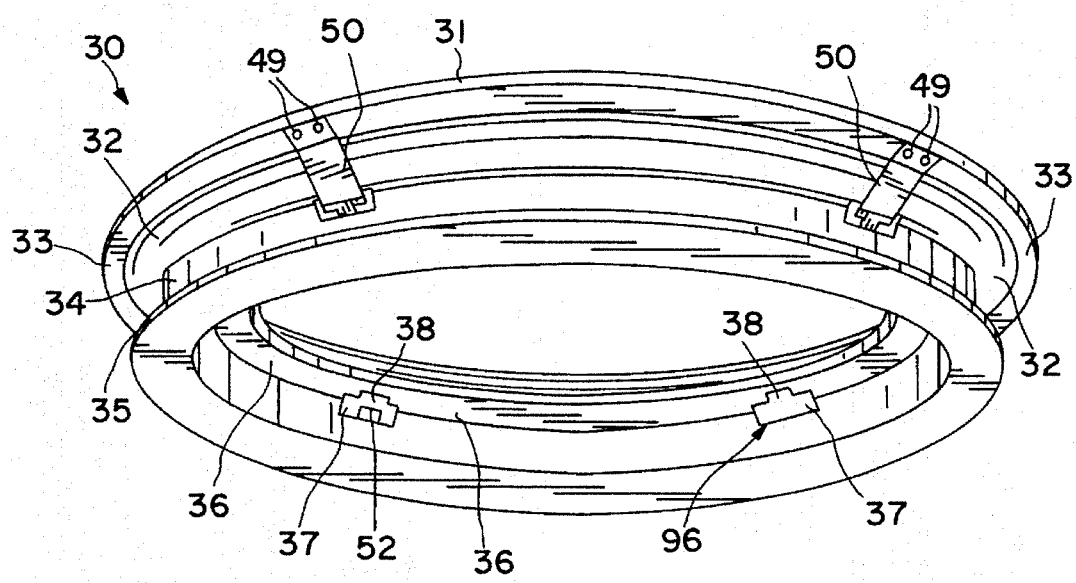
FIG. 2 shows a bottom isometric view of a clamping mechanism according to the present invention.

A top view of clamping mechanism 30 is shown in FIG. 1, and a bottom isometric view thereof is shown in FIG. 2. Referring to both FIGS. 1 and 2, clamping mechanism 30 comprises a frame 31 which surrounds the edges of substrate 2. As best shown in FIG. 1, the upper portion of frame 31 comprises a sloping portion 32 and a horizontal portion 33. Additionally, clamping mechanism 30 includes a substrate engaging surface 36, or holding surface, formed near the inner edge of frame 31 and at the bottom surface of clamping mechanism 30. Engaging surface 36 holds substrate 2 against platform 22 adjacent to the edges of substrate 2 when clamping mechanism 30 is fully extended to contact substrate 2. Clamping mechanism 30 is translatable between this fully extended position, where surface 36 engages substrate 2 to hold the substrate securely in place, and a retracted position located away from substrate 2 to release the wafer for transfer out of the processing chamber. Clamping mechanism 30 is translated between its extended and retracted positions by a translation mechanism shown in FIG. 7 and described in greater detail below in connection therewith.

Figure 4:
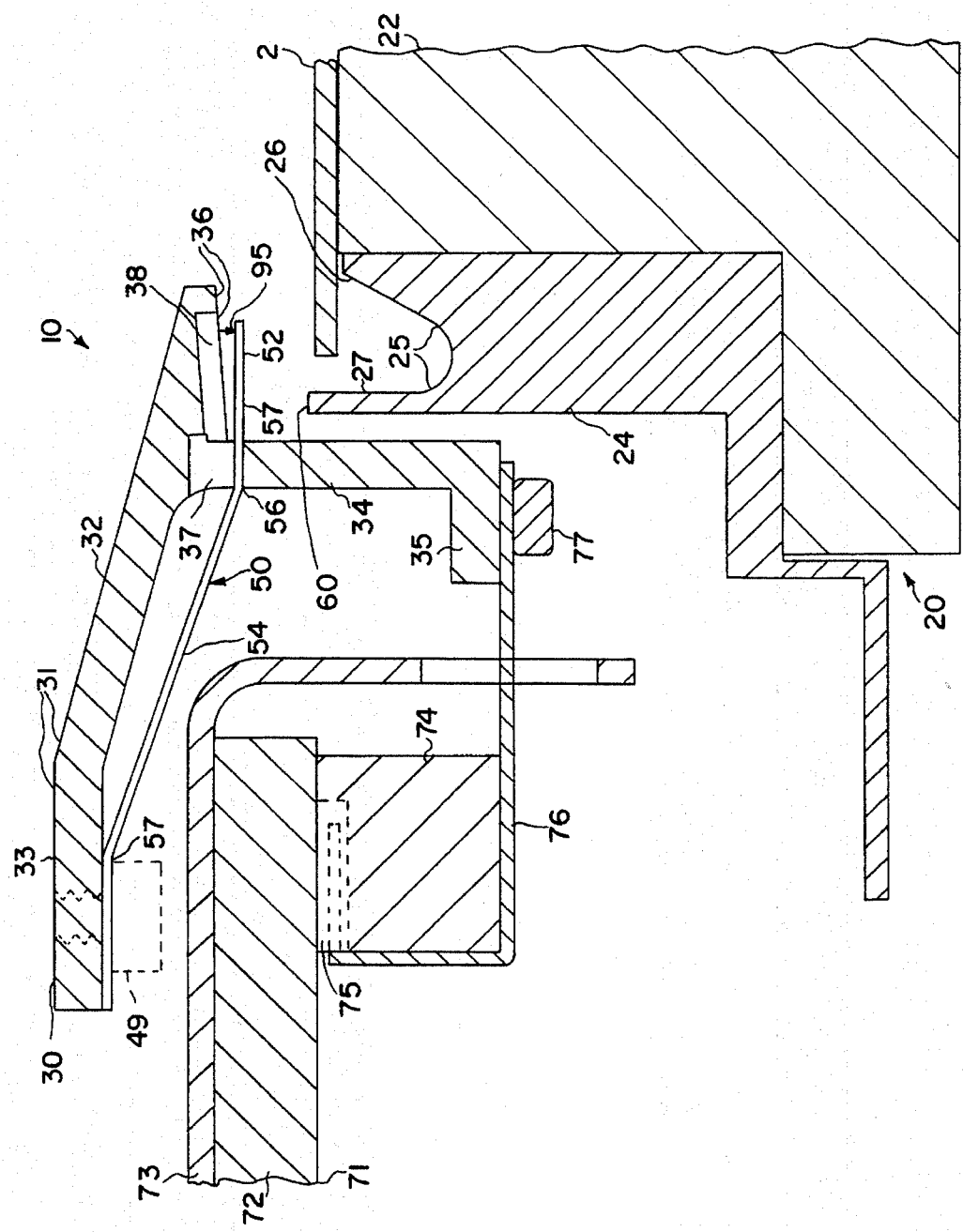
FIG. 4 shows a cross-sectional view of the clamping apparatus shown in FIGS. 1–3 with the clamping mechanism in a retracted position.

When substrate 2 is generally round, such as a semiconductor wafer, frame 31 preferably has an annular shape with an inner diameter slightly less than the diameter of substrate 2 and an outer diameter greater than the diameter of substrate 2. Clamping mechanism 30 further includes a first shield flange 34 extending downward from sloping portion 32 and a second shield flange 35 attached to first shield flange 34 and directed horizontally outward from the interior of frame 31. Flanges 34 and 35 are best shown in FIGS. 2 and 4, the latter of which shows a partial cross-sectional view through clamping mechanism 30.

There is a possibility that substrate 2 may adhere to engaging surface 36 when clamping mechanism 30 is moved away from substrate 2 to the retracted position. As described above, previously when a wafer becomes stuck to the clamp, manual intervention and system shutdown are required to correct the problem, with the associated down time of the entire system. In contrast, in accordance with the present invention, to free an adhering substrate from clamping mechanism 30, apparatus 10 further comprises substrate release means which preferably includes one or more retractable wafer release mechanisms 50 and one or more activators 60 positioned near support platform 22 and in cooperative relationship with the release mechanisms 50. The release mechanisms 50 are best shown in FIGS. 2 and 3A, which show an isometric view of clamp mechanism 30 and a release mechanism 50, respectively.

Figure 3A:
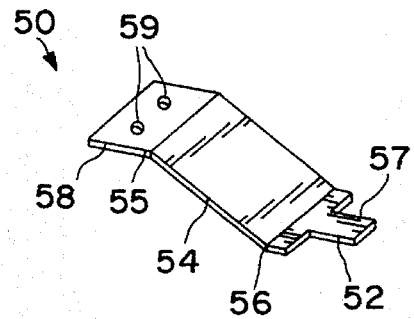
FIG. 3A shows an isometric view of a first embodiment of a spring release mechanism according to the present invention.

Referring to FIGS. 2 and 3A, release mechanism 50 comprises a leaf spring 54 having a generally rectangular shape with two bends 55 and 56 formed across the width of leaf spring 54 near respective ends thereof. Leaf spring 54 further comprises a projecting surface or finger 57 at one end thereof near bend 56, and an anchoring surface 58 formed at the other end near bend 55. Anchoring surface 58 is attached to the bottom side of frame 31, preferably on its horizontal portion 33, with the free portion of leaf spring 54 directed inward towards engaging surface 36 (see FIG. 2). To secure leaf spring 54 to frame 31, one or more corresponding apertures 39 (FIG. 1) and 59 (FIG. 3A) are formed in clamp means 30 and anchoring surface 58, respectively, and corresponding fasteners 49 such as screws (FIG. 2) are secured through apertures 39 and 59. At the opposite end of leaf spring 54, finger 57 provides an engaging surface 52 for engaging substrate 2 whenever substrate 2 adheres to engaging surface 36 of clamping mechanism 30. Finger 57 is positioned near the clamp's engaging surface 36, and leaf spring 54 biases finger 57 to extend away from engaging surface 36. This extension is shown at 95 in FIG. 4.

Apertures 37 are formed through flange 34 to allow leaf spring 54 to pass therethrough. Apertures 37 are best shown in FIG. 2 and in FIG. 4, which shows a partial radial cross-sectional view through clamping mechanism 30 and release mechanism 50. The above biasing of each finger 57 by its corresponding leaf spring 54 causes the finger 57 to be urged downward towards the lower wall of the corresponding wall aperture 37. Fingers 57 may contact these lower walls, which serve as position stops that limit the downward extension of the fingers 57.

For each finger 57, a recess 38 is formed in engaging surface 36 which is dimensioned to receive finger 57. Recess 38 may also receive a portion of leaf spring 54. Recess 38 preferably has a depth greater than the thickness of finger 57 such that finger 57 may be retracted completely within recess 38. As shown at 96 in FIG. 2, one of the leaf springs 54 has been omitted from the drawing so as more clearly show recess 38 and aperture 37 from a bottom view perspective of clamp mechanism 30.

Figure 5:
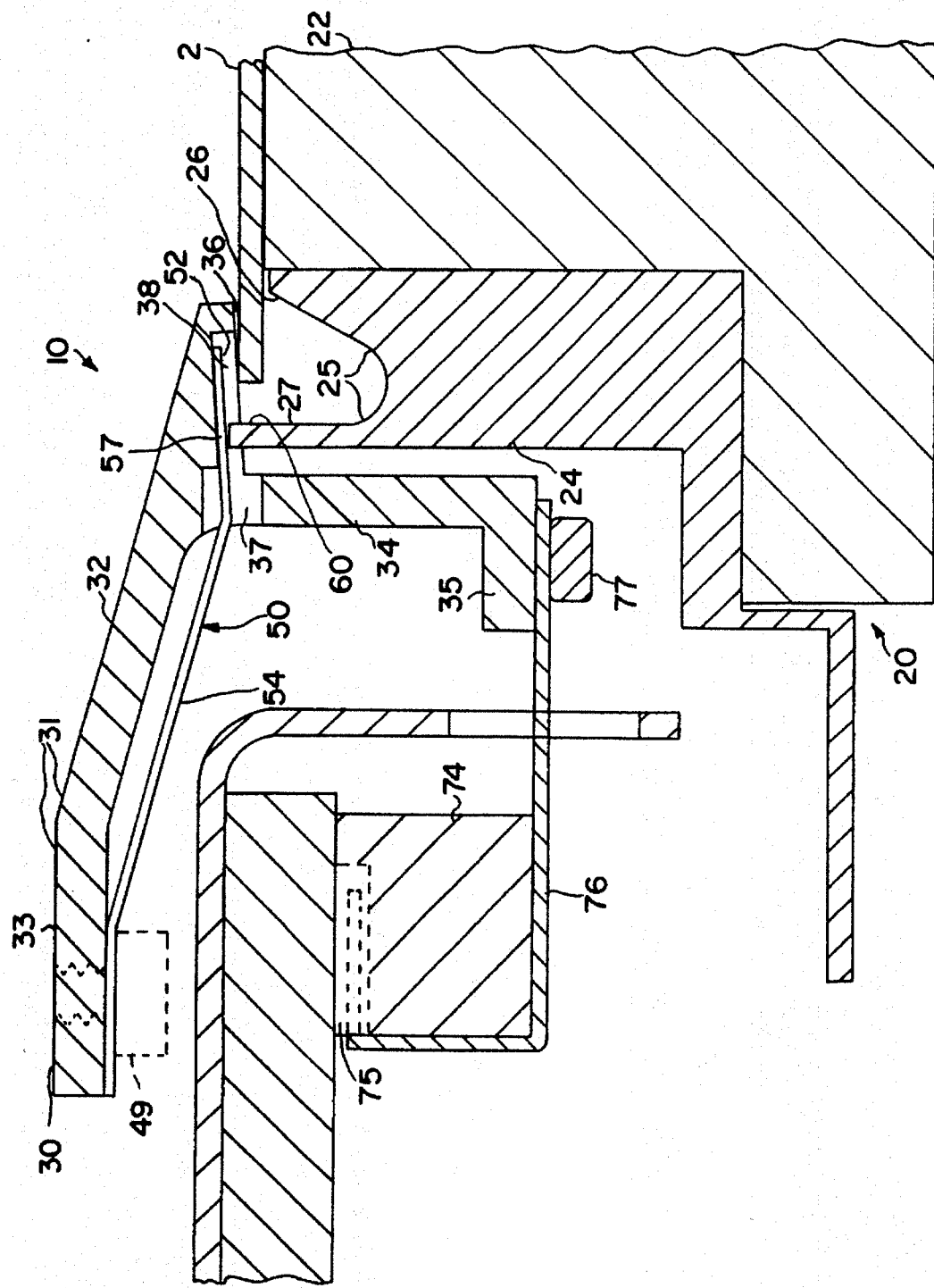
FIG. 5 shows a cross-sectional view of the clamping apparatus shown in FIGS. 1, 2, and 3A with the clamping mechanism in a fully extended (downwards) position.

The release means preferably further comprises one or more activators 60 located on outer lip 27 of heater shield, as shown in FIGS. 1 and 4. Activators 60 cooperate with leaf springs 54 to cause fingers 57 to retract into their corresponding recesses 38 whenever the engaging surface 36 of the clamp means is fully extended to contact substrate 2. In general, activators 60 are preferably positioned near support means 20 and in cooperative relationship with a respective finger 57 such that the activator pushes the finger 57 into its recess 38 whenever clamping mechanism is extended towards substrate 2. The action of activators 60 is shown in FIG. 5, which shows a partial cross-sectional view through clamping mechanism 30, release mechanism 50, and support means 20 with clamping means 30 in its extended position toward substrate 2.

Figure 6:
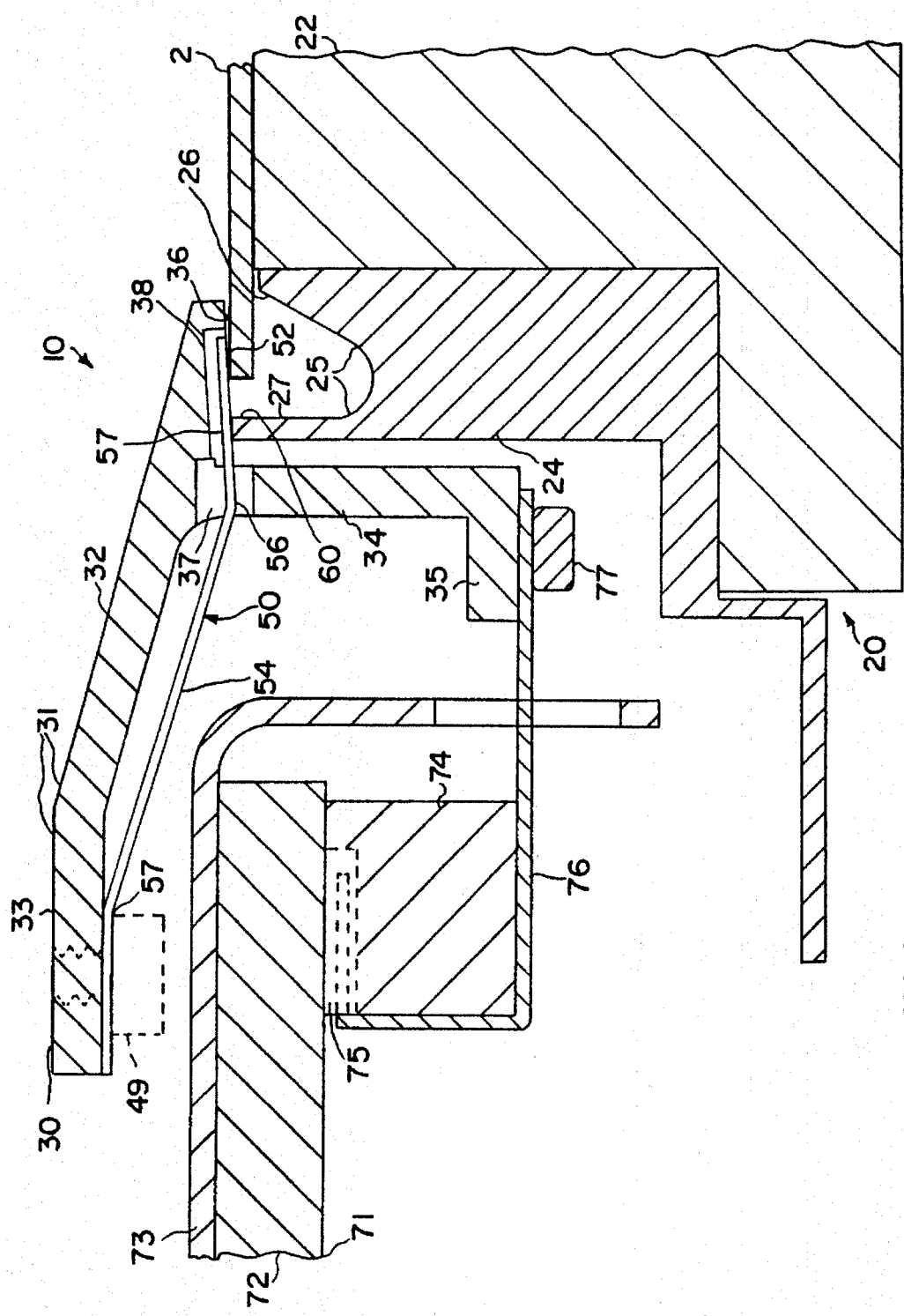
FIG. 6 shows a cross-sectional view of the clamping apparatus shown in FIGS. 1, 2, and 3A with the release mechanism engaging the surface of a stuck wafer substrate to free the substrate.

Activators 60 and leaf springs 54 enable fingers 57 to extend out and away from their corresponding recesses 38 when clamp means 30 is retracted from substrate 2. As clamp means 30 is retracted it moves away from activators 60, which are preferably fixedly mounted on outer lip 27, thereby allowing leaf springs 54 to return to their unflexed state. The force generated by the spring causes fingers 57 to move downward relative to clamp means 30 to an unloaded position, as shown in FIG. 4. In the event that a substrate 2 has adhered to the engaging surface 36 of the clamp means 30, upon retracting of clamping mechanism 30 away from the substrate, the fingers 57 extend out and engage substrate 2 at surface 52 to apply a force to free substrate 2 from the clamp's engaging surface 36. The engagement of surface 52 to substrate 2 just before substrate 2 is released is shown in FIG. 6. FIG. 6 shows a partial cross-sectional view through clamping mechanism 30, release mechanism 50, and support means 20 with clamping means 30 retracted and substrate 2 adhered to engaging surface 36.

In a preferred embodiment of the present invention, activator 60 is positioned such that it keeps surface 52 from engaging substrate 2 unless substrate 2 is stuck to the clamp. In the normal operation of the preferred embodiment of the present invention the force of gravity causes the substrate 2 to remain on platform 22 as clamping means 30 is retracted from the substrate. Thus, in the normal operation, the wafer release means is retracted as the clamp is fully extended such that it never contacts the substrate. This feature prevents contact between the spring and the wafer, thereby minimizing the chances of surface 52 tearing off flakes or portions of material from substrate 2, or otherwise generating particles which could contaminate the wafer. Moreover, this feature keeps surface 52 as clean as possible, thereby increasing reliability. However, the wafer release means are extended, i.e., unretracted, as the clamping means is retracted, so as to apply a separating force to a wafer that has become stuck to the clamping means.

Figure 3B:
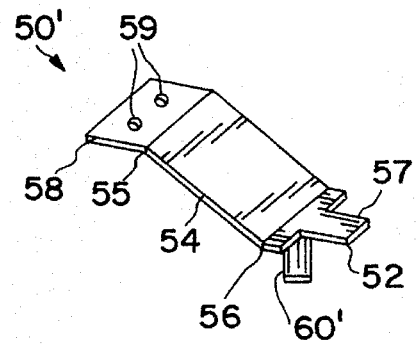
FIG. 3B shows an isometric view of a second embodiment of a spring release mechanism according to the present invention.

Although activators 60 are preferably mounted on lip 27 of support means 20, they need not be. For example, activators 60 may be mounted on leaf springs 54 in positions which contact the activators to lip 27 or another suitable contact surface under the desired conditions, such as an extension of support platform 22. A second embodiment of a spring release mechanism according to the present invention where an activator 60' is mounted on a leaf spring 54 is shown at 50' in FIG. 3B. Likewise, although a leaf spring has been shown, those skilled in the art will appreciate that other release mechanisms are equivalent and are, thus, considered to be within the scope of the present invention. For example, a coil spring mounted within a recess in the clamping means and having a wafer engaging surface on the free end thereof could also be used. Likewise, the use of a spring is not considered essential to the present invention. For example, the force for separating the wafer from the clamp could be generated by a mechanical linkage, as by the motor used to cause translation of the clamp means relative to the wafer platform or by gravity.

Additionally, although retraction of the wafer release means is preferred because it aids in minimizing the generation of particle contamination and increasing reliability, it is not generally necessary to retract the wafer release mechanism 50 in order to free a stuck substrate. In a less preferred embodiment of the present invention activators 60 are omitted and fingers 57 engage substrate 2 whenever clamping mechanism 30 engages substrate 2. In the extended position, both clamp mechanism 30 and leaf springs 54 apply forces to substrate 2, each of which is counterbalanced by forces from support platform 22. When clamp mechanism 30 is retracted, it stops applying its force to substrate 2, whether or not substrate 2 has adhered to it. However, leaf springs 54 continue to apply forces to substrate 2 until substrate 2 is freed from clamp mechanism 30 since they are normally biased away from the clamp's engaging surface 36. In this embodiment there is a greater possibility that substrate 2 could adhere to fingers 57 of the leaf springs 54 since they are in contact with the wafer during processing. However, it is noted that the surface area of these fingers is quite small and so the adherent force is likely to be rather weak. Moreover, as fingers 57 move substrate 2 away from clamp mechanism 30, they tend to rotate against the surface of substrate 2 and move outward. These motions tend to break any bonds that may form between substrate 2 and surfaces 52 of fingers 57.

Figure 7:
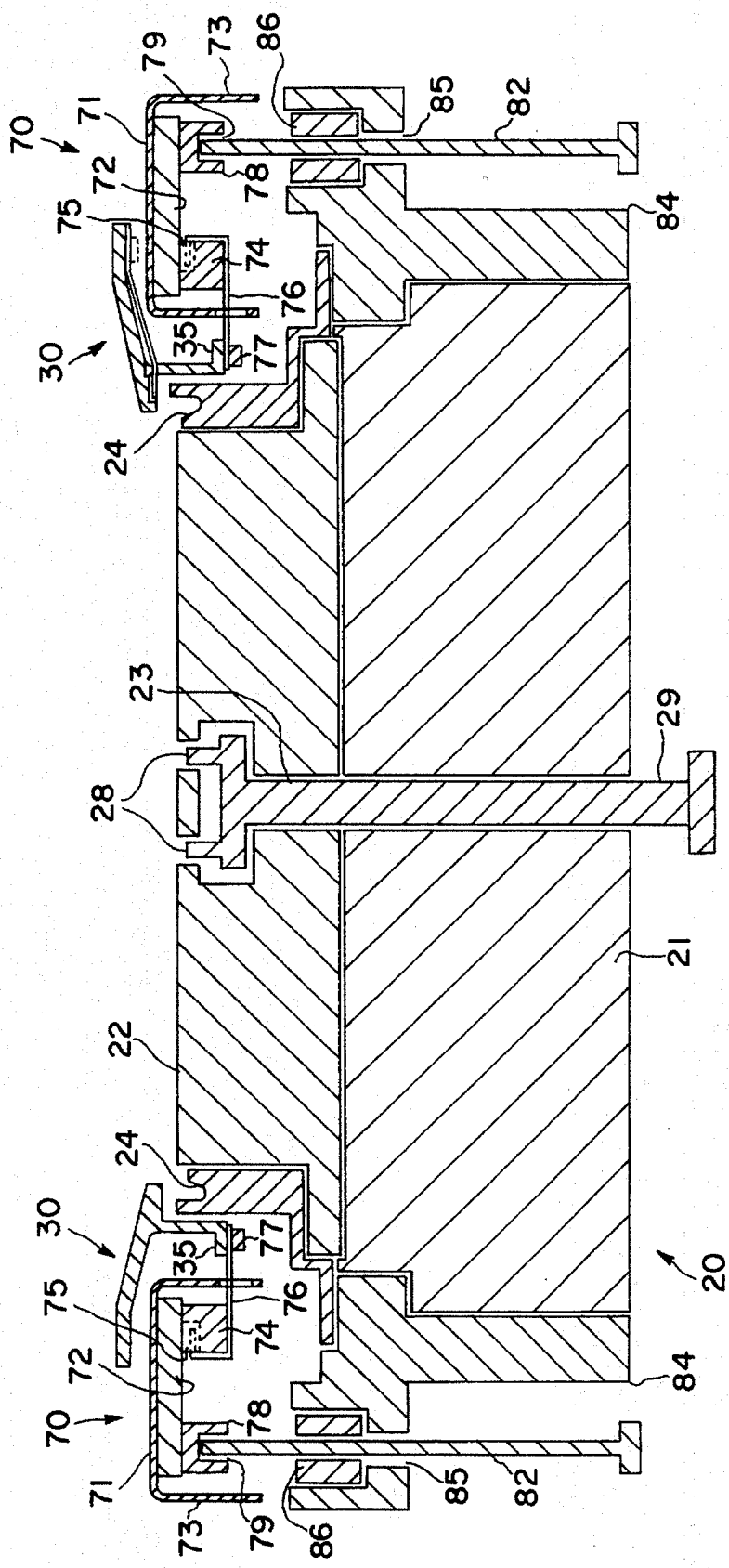
FIG. 7 shows a cross-sectional view of the clamp translation mechanism according to the present invention.

FIG. 7 is a full cross-sectional view of apparatus 10, as taken along the lines 7—7 shown in FIG. 1. The cross-sectional view of FIG. 7 shows the overall structure 70, connected to clamp mechanism 30, for providing means to translate the clamp mechanism and for providing sufficient weight to hold the substrate in position when the clamp mechanism is fully extended. Structure 70 comprises a frame assembly 71 which includes a weight 72, a cover shield 73 attached to the top surface of weight 72, an electrically insulated ring 74 attached to the bottom surface of weight 72, and a number of spring support arms 76 attached between insulated ring 74 and flange 35 of clamp mechanism 30. Each support arm 76 is attached to flange 35 by one or more fasteners 77, such as screws. Each support arm 76 preferable includes a U-shaped end which fits into a recess 75 of insulated ring 74 and around two faces of insulated member 74 to attach to insulated ring 74. Recess 75 is more clearly seen in FIG. 4.

Push rods 82, operable for pushing against frame assembly 71, are used to translate structure 70 and attached clamp mechanism 30 up and down. (For purposes of this specification, when the clamp is in an up position it is considered to be retracted and when it is in a down position, i.e., in contact with the substrate to clamp it against platform 22, it is considered to be fully extended.) A base support 84 is attached to support means 20 and has an aperture 85 through which each rod 82 is operated, and a sleeve guide 86 disposed within aperture 85 for aligning rod 82 to frame assembly 71. Rod 82 is capable of moving within aperture 85 and guide 86. For receiving the end of rod 82, frame assembly 71 further includes an alignment member 78 attached to weight 72 and having a recess 79 positioned in cooperative relationship with rod 82. When extended, rod 82 fits into recess 79 and pushes against alignment member 78, and in turn frame assembly 71, as is shown in FIG. 7. Frame assembly 71, thus, retracts clamp mechanism 30 away from support means 20.

Rod 82 may be used to translate clamp mechanism 30 and frame assembly 71 a sufficient distance away from platform 22 so that a robot arm may be used to place and remove substrate 2 on platform 22. The substrate support means 20 may include three or more centrally distributed pins 28 for raising substrate 2 above platform 22 so that a robot arm may readily grasp substrate 2 from below. As noted above, these operations are performed with platform 22 in a horizontal orientation so that gravity acts to hold the wafer on platform 22, or on the support pins, when the clamp is not engaged. Pins 28 are attached to a push rod 29, which moves within an aperture 23 of platform 22.

When rod 82 is translated downward, structure 70 and clamping mechanism 30 move toward support means 20. The movement of clamp mechanism 30 and frame assembly 71 stops when clamp mechanism 30 engages a substrate. (If substrate 2 is not present, this movement stops when clamp mechanism 30 engages shield 24.) In one embodiment, rods 82 are not physically attached to structure 70, such that they may partially or fully withdraw from recess 79 after the clamp has engaged a wafer. In this embodiment, a sufficient clamping force is achieved by controlling the combined weight of structure 70 and clamp mechanism 30. The overall weight is set at a predetermined desired value by adjusting the size of weight 72.

In another embodiment, after a wafer is loaded onto the platform, the platform is rotated to a vertical orientation to conduct processing. In such a case rods 82 must be attached to structure 70 and a spring mechanism (not shown) may be used to provide the necessary clamping force.

In one embodiment of the present invention, frame assembly 71 has a weight of approximately 2.5 kilograms (5.5 pounds). Approximately 1.6 kilograms (3.5 pounds) of this weight is applied to the periphery of substrate 2 while approximately 0.9 kilograms (2 pounds) is applied to activators 60 by way of leaf springs 54.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. Apparatus for releasably clamping a substrate to a support means in a processing chamber, comprising:

support means for supporting said substrate, said substrate having an edge at its periphery;

clamp means translatable between an extended position and a retracted position, said clamp means for securely engaging the substrate at a plurality of points adjacent to said substrate edge when in its extended position, said clamp means moving away from the support means when being translated to its retracted position;

a substrate release means mounted to said clamp means for preventing the substrate from adhering to said clamp means when said clamp means is retracted from its extended position, said substrate release means having a substrate releasing surface translatable between an extended position and a retracted position relative to said clamp means, said substrate releasing surface being extended as said clamp means is retracted such that, upon retraction of said clamp means from its extended position, said substrate releasing surface engages a surface of the substrate whenever it adheres to said clamp means so as to release it from said clamp means.

2. The apparatus of claim 1 wherein said substrate releasing surface of said substrate release means is retracted when said clamp means is fully extended such that said substrate releasing surface does not contact the substrate when said clamp means is in its extended position.

3. The apparatus of claim 1 wherein said substrate release means comprises at least one spring release mechanism for engaging respective surfaces of the substrate in the event the substrate adheres to said clamp means.

4. The apparatus of claim 3 wherein said substrate release means further comprises at least one activator positioned in cooperative relationship to said at least one spring release mechanism to cause said at least one spring release mechanism to retract when said clamp means is fully extended such that said at least one spring release mechanism does not contact the substrate, and wherein upon retraction of said clamp means from the substrate said at least one activator enables said at least one spring release mechanism to extend and engage a substrate which has adhered to said clamp means.

5. The apparatus of claim 3 wherein said substrate release means further comprises a contact surface positioned opposite to said at least one spring release mechanism, and wherein said at least one spring release mechanism includes an activator mounted thereto and positioned in cooperative relationship to said contact surface to cause said at least one spring release mechanism to retract when said clamp means is fully extended such that said at least one spring release mechanism does not contact the substrate, upon retraction of said clamp means from the substrate said activator and contact surface enabling said at least one spring release mechanism to extend and engage a substrate which has adhered to said clamp means.

6. A semiconductor processing apparatus comprising:
   a wafer support platform;
   a retractable wafer clamping mechanism for holding a wafer near an edge thereof on said wafer support platform when in a fully extended position;
   a plurality of spring release mechanisms for engaging respective surfaces of the wafer in the event the wafer adheres to said wafer clamping mechanism, the engaged spring release mechanisms causing the release of the wafer from said wafer clamping mechanism; and
   a plurality of activators positioned in cooperative relationship to said spring release mechanisms to cause said spring release mechanisms to retract when said wafer clamping mechanism is fully extended such that said spring release mechanisms do not contact the wafer, but wherein upon retraction of said wafer clamping mechanism from said wafer, said activators enable said spring release mechanisms to extend and engage said wafer which has adhered to said wafer clamping mechanism.

7. The apparatus of claim 6 wherein said plurality activators are positioned near said support platform.

8. A substrate processing apparatus comprising:
   a substrate support platform;
   a retractable clamping mechanism having a holding surface for holding a substrate against said support platform when in a fully extended position, said clamping mechanism including a plurality of spring release mechanisms, each biased to apply a force to a surface of the substrate whenever said substrate adheres to said holding surface upon retraction of said clamping mechanism from said fully extended position; and
   a plurality of activators positioned in cooperative relationship with said spring release mechanisms to cause said spring release mechanisms to retract from engaging respective surfaces of the substrate when said retractable clamping mechanism is extended to hold the substrate against said support platform.

9. The apparatus of claim 8 further comprising a contact surface positioned opposite to one of said spring release mechanisms, and wherein said one of said spring release mechanisms includes an activator mounted thereto and positioned in cooperative relationship to said contact surface to cause said spring release mechanism to retract from engaging a respective surface of the substrate when said retractable clamping mechanism is extended to hold the substrate against said support platform.

10. A clamp mechanism comprising:
   a holding surface for engaging a substrate near an edge thereof against a support platform;
   a spring release mechanism biased to engage a surface of the substrate whenever the substrate adheres to said holding surface upon retraction of said holding surface away from the substrate; and
   an activator positioned in cooperative relationship to said spring release mechanism to cause said spring release mechanism to retract from engaging a surface of the substrate when said holding surface is holding said substrate against the support platform.

11. A method of releasably clamping a substrate to a support means in a deposition processing chamber, comprising the steps of:
   positioning a substrate having a peripheral edge upon said support means for processing;
   engaging said substrate at its peripheral edge with a clamp means;
   translating said clamp means between an extended position and a retracted position wherein said substrate is securely engaged by said clamp means so as to be held against said support means in said extended position, said clamp means releasing said substrate upon being moved away from said support means in said retracted position;
   depositing a material on said substrate while said substrate is being held against said supporting means; and
   preventing said substrate from adhering to said clamp means when said clamp means is retracted from its extended position by releasing said substrate using a substrate releasing surface mounted to said clamp means, said substrate releasing surface being translated between an extended position and a retracted position relative to said clamp means so as to be extended as said clamp means is retracted whereupon said substrate releasing surface engages a surface of said substrate to cause it to be released from said clamp means whenever said substrate adheres thereto.

* * * * *